(12) United States Patent
Ho et al.

(10) Patent No.: US 7,096,304 B2
(45) Date of Patent: Aug. 22, 2006

(54) APPARATUS AND METHOD FOR MANAGING VOLTAGE BUSES

(75) Inventors: Duc V. Ho, Allen, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 291 days.

(21) Appl. No.: 10/750,735

(22) Filed: Dec. 31, 2003

(65) Prior Publication Data

US 2005/0140349 A1    Jun. 30, 2005

(51) Int. Cl.
G06F 13/28   (2006.01)
G06F 1/26    (2006.01)
H02M 1/00    (2006.01)

(52) U.S. Cl. .................. 710/306; 713/300
(58) Field of Classification Search ............. 363/144, 363/147; 710/62, 64, 104, 107, 305, 306, 710/313; 713/300, 323, 330, 340
See application file for complete search history.

(56) References Cited

U.S. PATENT DOCUMENTS

| | | | |
|---|---|---|---|
| 6,202,115 B1 * | 3/2001 | Khosrowpour | 710/312 |
| 6,240,028 B1 | 5/2001 | Ho | |
| 6,557,090 B1 | 4/2003 | Ho | |
| 6,586,979 B1 | 7/2003 | Gomm et al. | |
| 6,617,879 B1 * | 9/2003 | Chung | 326/82 |
| 6,643,713 B1 * | 11/2003 | Nakagawa et al. | 710/5 |
| 6,798,188 B1 * | 9/2004 | Dathe et al. | 324/103 P |
| 6,871,291 B1 * | 3/2005 | Chan et al. | 713/340 |
| 6,940,340 B1 * | 9/2005 | Liu | 327/551 |

OTHER PUBLICATIONS

U.S. Appl. No. 10/231,509, filed Aug. 29, 2002, Gomm et al.
U.S. Appl. No. 09/815,465, filed Mar. 23, 2001, Gomm et al.
Gomm et al., Power Reduction For Delay Locked Loop CIrcuits, Published Dec. 19, 2002.
Gomm et al., Method for Noise and Power Reduction For Digital Delay Lines; Published Sep. 26, 2002.

* cited by examiner

*Primary Examiner*—Matthew V. Nguyen
(74) *Attorney, Agent, or Firm*—Fletcher Yoder

(57) ABSTRACT

The present technique relates to a method and apparatus for managing voltage buses. In a memory device, such as SRAM or DRAM, a periphery voltage bus may supply voltage to periphery circuitry and an array voltage bus may supply voltage to array circuitry. A bridge circuit may be utilized to isolate the buses from each other and couple the buses together, depending on the control signals are received by the bridge circuit. As such, the bridge circuit enhances the operation of the memory device by reducing duplicative circuits and equalizing the voltage that are applied to the buses. In addition, the bridge circuit isolates the buses from each other to protect sensitive circuitry in the array and periphery circuitry from noise on the other bus.

40 Claims, 6 Drawing Sheets

APPARATUS AND METHOD FOR MANAGING VOLTAGE BUSES

BACKGROUND OF THE INVENTION

1. Field of the Invention

The present invention relates generally to semiconductor devices and, more particularly, to the distribution of power in array and periphery sections of a semiconductor device, such as a memory device.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, telephones, vehicle control systems, networks, and a host of other consumer products. Typically, microprocessors are essentially generic devices that perform specific functions under the control of a software program. This program is stored in a memory device that is coupled to the microprocessor. Not only does the microprocessor access one or more memory devices to retrieve the program instructions, but it also stores and retrieves data created during execution of the program in the memory devices.

It should be understood that memory devices, which may be a semiconductor chip, include integrated circuits that are typically mass produced through fabrication processes. In forming the chip, different materials are layered together to form various structures or circuitry within the chip. These structures are connected together to exchange signals, distribute power within the chip and receive power from external devices, among other things. Additionally, the semiconductor chip may be divided into different sections, such as the array section and the periphery section. The array section may include memory structures, such as memory cells and banks that are used to store data, while the periphery section may include larger structures that support the array section, such as drivers, interconnects between circuitry, decoders or other similar circuitry.

Regardless of the specific structures within the semiconductor chip being fabricated, it is often desirable to conserve power and to ensure that the power distributed to various circuits is provided in a consistent and steady manner. For instance, in a personal computing device, the configuration and layout of components may affect the operation and efficiency of the device. During a power-up phase, different sections of the chip, such as the periphery and array sections, may not reach a specified voltage at the same time. This variation in time may result in the chip taking longer to power up from an initialization or standby mode to an operation mode because one of the sections takes longer to reach the operational voltage. As a result, these inefficiencies may reduce the amount of time that the device is able to operate in an active or standby mode.

BRIEF DESCRIPTION OF THE DRAWINGS

The foregoing and other advantages of the present technique may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present technique is an improved approach for managing voltage buses to conserve power and to ensure that the power distributed to various circuits is provided in a consistent and steady manner. Under the present technique, a bridge circuit may be utilized to connect voltage buses together or isolate voltage buses from each other to enhance the operation of circuitry within a semiconductor chip. The bridge circuit may be controlled by control signals associated with different modes of operation within the semiconductor chip. As a result of the bridge circuit, the operation of the semiconductor chip may be enhanced because the problems associated with different voltages being applied to the different circuitry may be diminished. In addition, duplicate components may be removed to further reduce leakage within the semiconductor chip.

Figure 1:
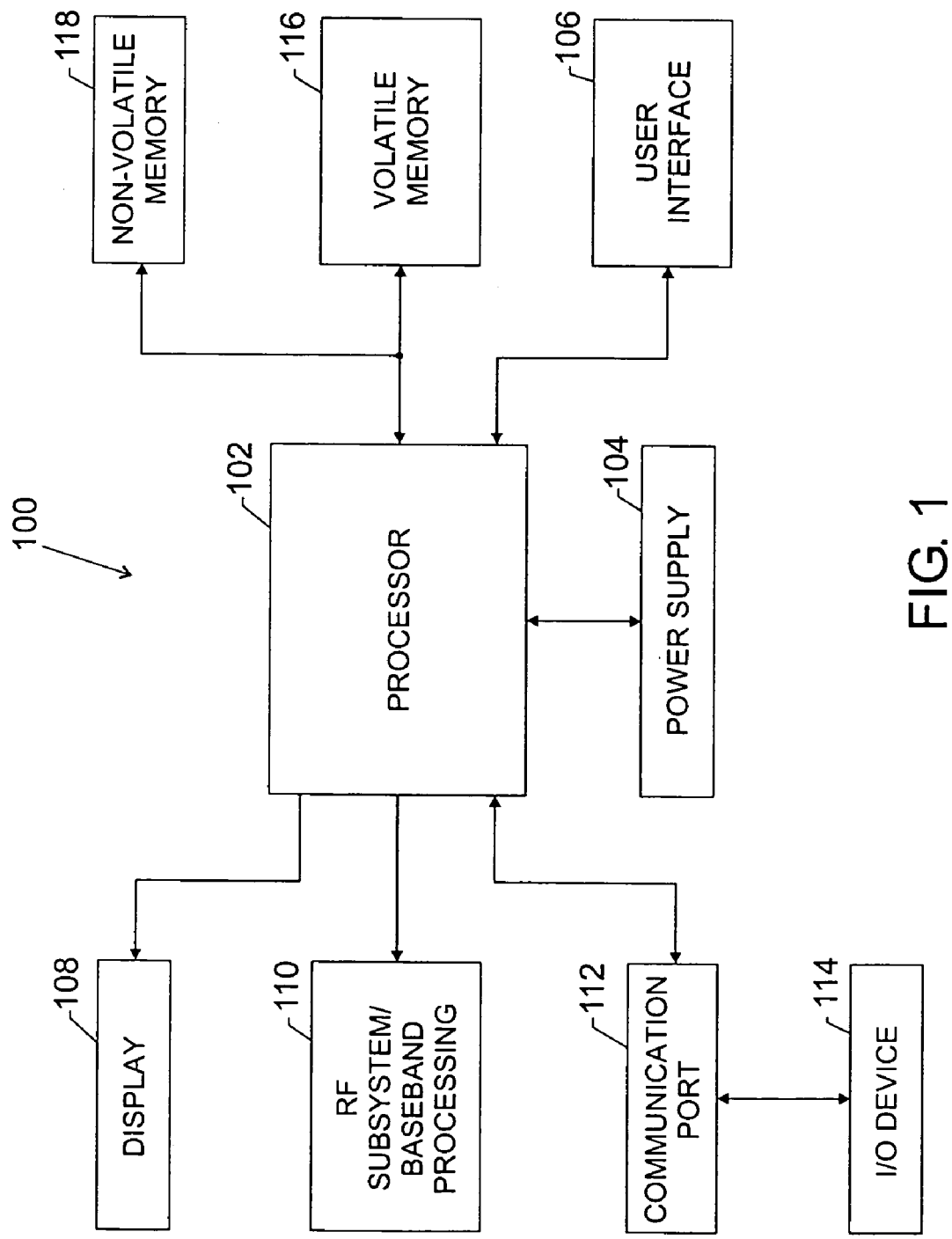
FIG. 1 illustrates a block diagram of an exemplary processor-based device in accordance with the present technique.

Turning now to the drawings, and referring initially to FIG. 1, a block diagram depicting an exemplary processor-based device, generally designated by the reference numeral 100, is illustrated. The device 100 may be any of a variety of different types of devices, such as a computer, a pager, a cellular telephone, a personal organizer, a control circuit, etc. In a typical processor-based device, a processor 102, such as a microprocessor, controls many of the functions of the device 100.

The device 100 typically includes a power supply 104 that delivers power to the device. The type of power supply 104 may vary depending on the function of the device 100. For instance, if the device 100 is portable, the power supply 104 may advantageously include permanent batteries, replaceable batteries, and/or rechargeable batteries. The power supply 104 may also include an A/C adapter, so that the device 100 may be plugged into a wall outlet, for instance. In addition, the power supply 104 may also include a D/C adapter, so that the device 100 may be plugged into a vehicle's cigarette lighter, as well. Alternatively, if the power supply 104 is not portable, it may be configured with the A/C adapter to be plugged into a wall outlet.

Various other devices may be coupled to the processor 102, depending upon the functions that the device 100 performs. For instance, a user interface 106 may be coupled to the processor 102 to receive information. The user interface 106 may include buttons, switches, a keyboard, a light pen, a mouse, and/or a voice recognition system, for instance. A display 108 may also be coupled to the processor 102 to present information to the user. The display 108 may include an LCD display, a CRT, LEDs, and/or an audio display. Furthermore, an RF subsystem/baseband processor 110 may also be coupled to the processor 102 to communicate with other devices through a wireless link. The RF subsystem/baseband processor 110 may include an antenna that is coupled to an RF receiver and to an RF transmitter (not shown). A communications port 112 may also be coupled to the processor 102 to communicate with other devices through a physical link. The communications port 112 may be adapted to couple with one or more input/output (I/O) devices 114, such as a modem, a printer, or a computer, for instance.

Because the processor 102 controls the functioning of the device 100 generally under the control of software programming, memory is coupled to the processor 102 to store and to facilitate execution of software programs. For instance, the processor 102 may be coupled to volatile memory 116, which may include dynamic random access memory (DRAM) and/or static random access memory (SRAM). The amount of DRAM and SRAM may depend on the specific design of the device 100. The processor 102 may also be coupled to non-volatile memory 118. The non-volatile memory 118 may include a read only memory (ROM), such as an erasable programmable ROM, to be used in conjunction with the volatile memory 116. The size of the ROM is typically selected to be just large enough to store any necessary operating system, application programs, and fixed data. The volatile memory 116, on the other hand, is typically quite large so that it can store dynamically loaded applications. Additionally, the non-volatile memory 118 may include a high capacity memory, such as a disk or a tape drive memory.

In operating the processor-based device 100, it may be advantageous to conserve power so that the device 100 may remain active longer. As such, the components of the device 100 may be designed to reduce redundant components, to operate more efficiently, and to consume less power. For instance, the volatile memory 116 may be designed to remove duplicative circuits or to share circuits when the device 100 is operating in different modes, such as a power-up mode, an idle mode, an activation mode, a read/write burst mode, a standby mode, or a power-down mode. By reducing the duplicative circuits, the power lost or consumed by the redundant circuits may be eliminated, as described further below. As a result, the device 100 may remain active for longer periods of time and may operate more efficiently on a limited power source.

In addition, each of the components associated with the device 100 may have different activation time periods before which the component may become operational. For instance, the volatile memory 116 may become active after the communication port 112 because different sections of the volatile memory 116 have different activation time periods that prolong its activation. To reduce the delay in activating the device 100, the volatile memory 116 may be designed to maintain a voltage on various components or to operate in different modes, which reduce the amount of time consumed to activate or initialize the device 100.

As mentioned previously, a processor-based device 100 may include integrated circuits or structures in the semiconductor chips, which are utilized to provide different functionalities to the device 100. For instance, the semiconductor chips in the volatile memory 116 may utilize the power from the power supply 104 to perform specific functions, such as storing data or software programs. As such, improvements in the power distribution in the semiconductor chips may reduce the power consumed by the volatile memory 116 and provide faster access to the information stored in the volatile memory 116. The power distribution in a semiconductor chip is explained in greater detail with FIG. 2.

Figure 2:
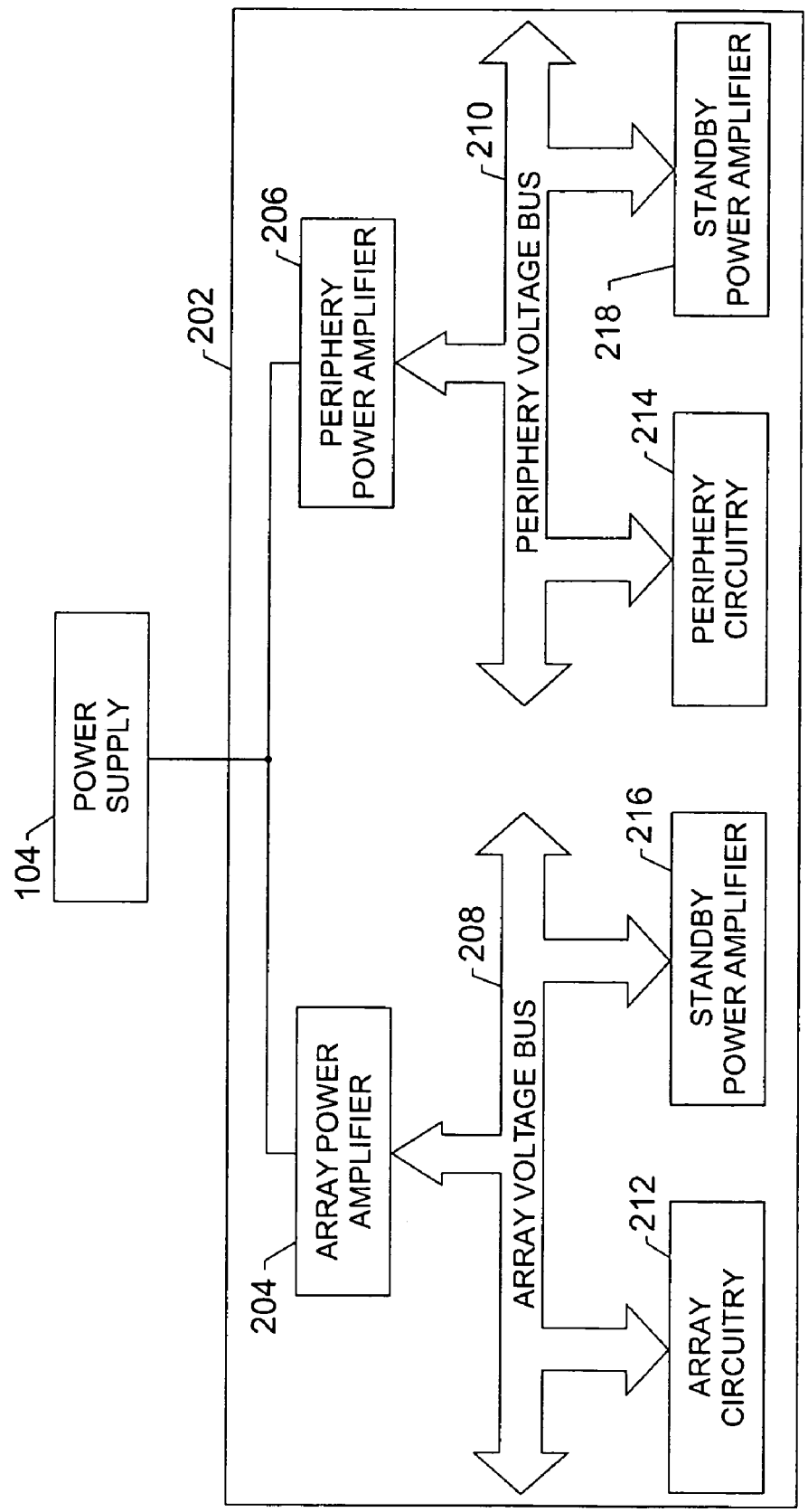
FIG. 2 illustrates a block diagram of an exemplary embodiment of a semiconductor chip used in the processor-based device of FIG. 1.

Turning now to FIG. 2, a block diagram of an exemplary embodiment of a power distribution system in a semiconductor chip is illustrated. In this power distribution system 200, a semiconductor chip 202, which may be a portion of the processor-based device 100 of FIG. 1, may receive power from the power supply 104, which is discussed above in FIG. 1. The power delivered to the semiconductor chip 202 may be distributed to two different sections of the chip 202, which may include an array section and a periphery section. The array section may include memory banks for DRAM, SRAM, or other memory types. The periphery section may include circuitry and other structures used to support the array section, such as drivers, interconnects between circuitry, decoders or other similar circuitry.

The array and periphery sections of the semiconductor chip 202 may also include components to distribute power within the semiconductor chip 202. For instance, power may be delivered from the power supply 104 to an array power amplifier 204 and a periphery power amplifier 206. Each of the power amplifiers 204 and 206 may represent multiple power amplifiers or power regulators that are assigned to different sections of the chip 202. The power amplifiers 204 and 206 may modify the voltage and drive it to a respective array voltage bus 208 or a periphery voltage bus 210. The array voltage bus 208 may apply a specified voltage to an array circuitry 212, while the periphery voltage bus 210 may apply a specified voltage to a peripheral circuitry 214. Also, the array voltage bus 208 may connect to an array standby power amplifier 216 that supplies the array voltage bus 208 with voltage when the semiconductor chip 202 is in a standby mode. The periphery voltage bus 210 may include a periphery standby power amplifier 218 that supplies the periphery circuitry 214 with voltage when the semiconductor chip 202 is in a standby mode.

During the normal mode of operation, which may include an activation mode or a read/write burst mode, the voltage buses 208 and 210 may supply different voltages to the circuitry 212 and 214. The activation mode may include executing commands in the array circuitry 212 and the periphery circuitry 214, while the read/write mode may include accessing data from or providing data to the array circuitry 212 and the periphery circuitry 214. In these modes, a first voltage may be applied to the array circuitry 212 from the array voltage bus 208, while a second voltage may be applied to the periphery circuitry 214 from the periphery voltage bus 210. The voltages applied to the array circuitry 212 and periphery circuitry 214 may be different because each of the circuits has a different capacitance. The capacitances differ because each circuitry 212 and 214 has different components coupled to the respective circuitry 212 and 214. As a result, the voltage levels on the array circuitry 212 and the periphery circuitry 214 may differ, which may produce errors within the semiconductor chip 202.

Also, during a standby or an inactive mode of operation, which may include a power-up mode, an idle mode, a standby mode, and/or a power-down mode, the voltage buses 208 and 210 may provide different voltages to the circuitry 212 and 214. The standby mode may maintain power to specific components, while other components are shut down. The power-up mode may distribute power to the various components within the array circuitry 212 and the periphery circuitry 214, while the power-down mode may reduce or stop the voltage from being applied to components within the array circuitry 212 and the periphery circuitry 214. The idle mode may maintain power to the various components, while waiting for other instructions to be received. With each of these modes, a first voltage may be provided to the array circuitry 212 from the array standby amplifier 216, while a second voltage may be provided to the periphery circuitry 214 from the periphery standby amplifier 218. During these modes, the voltages applied to the array circuitry 212 and periphery circuitry 214 may also be different because the array standby amplifier 216 and the periphery standby amplifier 218 are each isolated from one another and depend on the respective capacitances of the circuitry 212 and 214. As a result of these voltage differences, operational problems may again be present in the array circuitry 212 and the periphery circuitry 214.

In addition, in each of these modes, the array circuitry 212 and the periphery circuitry 214 may each have redundant power amplifiers 204 and 206 and standby amplifiers 216 and 218 that provide duplicative services for the respective circuitry 212 and 214. As a result, each of the power amplifiers 204 and 206 and standby power amplifiers 216 and 218 may consume additional amounts of power. As such, the redundant components may further increase the power consumed by the semiconductor chip 202.

To enhance the operation of the semiconductor chip 202, a bridge circuit may be implemented that enables the voltage buses 208 and 210 to share components and to maintain the same voltage level on each of the voltage buses 208 and 210. The bridge circuit may act as a short during certain modes to allow components, such as power amplifiers 204 and 206 and standby power amplifiers 216 and 218 to share components while maintaining redundancy. Also, by acting as a short, the bridge circuit may equalize the voltage between the array circuitry 212 and periphery circuitry 214 to minimize the errors that result from different voltages being applied to the circuitry 212 and 214. Alternatively, the bridge circuit may isolate the buses 208 and 210 from each other during other modes. An alternative exemplary embodiment relating to the distribution of power in a semiconductor chip with components, such as a bridge circuit, is explained in greater detail with respect to FIG. 3.

Figure 3:
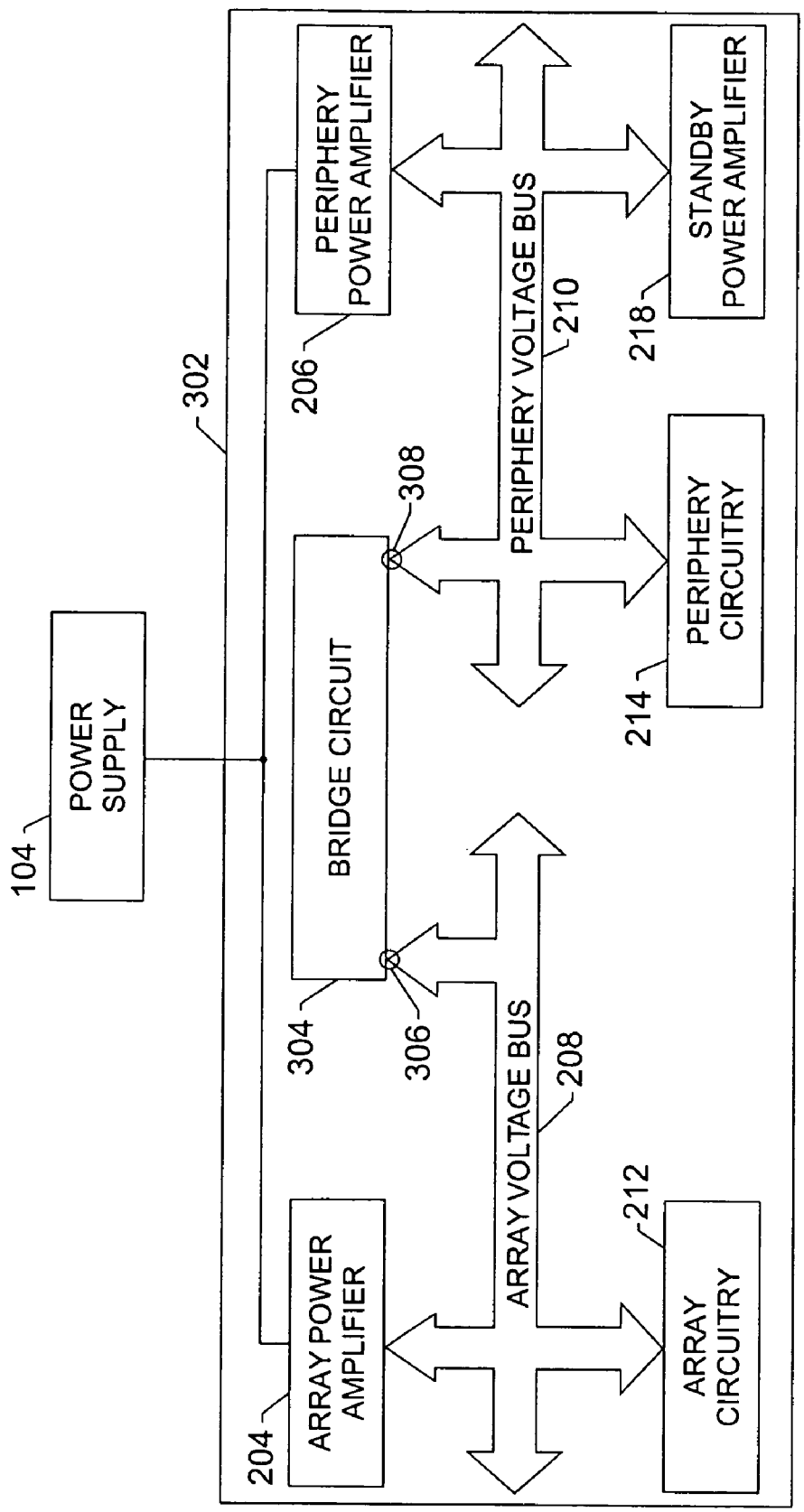
FIG. 3 illustrates a block diagram of an alternative exemplary embodiment of a semiconductor chip used in the processor-based device of FIG. 1 in accordance with aspects of the present technique.

In FIG. 3, a block diagram depicting an alternative exemplary embodiment of the power distribution in a semiconductor chip is illustrated. In this diagram 300, a semiconductor chip 302, which may be a portion of the processor-based device 100 of FIG. 1, may include a bridge circuit 304 to improve the operation of the semiconductor chip 302. Similar to the semiconductor chip 202 in FIG. 2, the semiconductor chip 302 may include various amplifiers 204, 206, and 218, buses 208 and 210, and circuitry 212 and 214, which may function as discussed above with regard to FIG. 2. Also, the semiconductor chip 302 may receive power from the power supply 104 in a manner similar to the semiconductor chip 202 (FIG. 2).

However, to provide enhanced functionality, the bridge circuit 304 may be coupled between the array power amplifier 204 and the array voltage bus 208 at a node 306 and coupled between the periphery power amplifier 206 and the periphery voltage bus 210 at a node 308. By coupling the bridge circuit 304 between the power amplifiers 204 and 206 and respective voltage buses 208 and 210, the voltages applied to the array circuitry 212 and the periphery circuitry 214 may be maintained at approximately the same level in certain modes of operation. In other modes of operation, however, the bridge circuit 304 may remain open to provide isolation. The isolation may prevent noise from one of the buses 208 and 210 from affecting the sensitive circuitry on the other bus 208 and 210. For instance, by isolating the buses 208 and 210, the bridge circuit 304 may prevent noise on the array voltage bus 208 from interfering with the operation of periphery circuitry 214 that is sensitive to voltage fluctuations. Thus, the bridge circuit 304 may enhance the operation of the semiconductor chip 302.

For instance, during the normal mode of operation, which may include the activation mode or the read/write burst mode, the power amplifiers 204 and/or 206 may apply voltages to the array circuitry 212 and the periphery circuitry 214, respectively. If the bridge circuit 304 is closed, the bridge circuit 304 may short the two voltage buses 208 and 210 together. In this instance, the voltage applied to the array circuitry 212 and periphery circuitry 214 is approximately equal because the voltage buses 208 and 210 are coupled together by the bridge circuit 304. As such, the errors resulting from voltage variations in the circuitry 212 and 214 may be reduced. In addition, the array circuitry 212 and periphery circuitry 214 may share the standby amplifier 218 and/or power amplifiers 204 and 206, which may reduce the amount of power consumed by redundant components within the semiconductor chip 302. The sharing of standby amplifier 218 or power amplifiers 204 and 206 may allow the voltage buses 208 and 210 to share components and still provide some redundancy. Conversely, if the bridge circuit 304 is open, then the voltage buses 208 and 210 may be isolated from one another to provide protection between the buses 208 and 210 for noise isolation, for example.

During the standby mode of operation, which may include a power-up mode, an idle mode, a standby mode, and/or a power-down mode, the bridge circuit 304 may be closed to act as a short, and the standby amplifier 218 may supply power to the array circuitry 212 and the periphery circuitry 214. As with the normal mode of operation, the voltage applied to the array circuitry 212 and periphery circuitry 214 may be substantially equal because the standby amplifier 218 is supplying power to the array 212 and periphery circuitry 214. As such, the operation of the circuitry 212 and 214 may be enhanced because operational problems associated with differences in voltage levels on the different circuitry 212 and 214 may be reduced.

In addition, it should be noted that the standby power amplifier 218 may be removed and the standby power amplifier 216 may be attached to the array circuitry 216 in an alternative embodiment. In this embodiment, the standby power amplifier 216 may supply power from the array circuitry 212 to the periphery circuitry 214 to provide the advantage discussed above. For a better understanding of the operation of the bridging circuit 304, a more detailed embodiment of the power distribution system in a semiconductor chip 302 is explained with regard to the different modes of operation in FIG. 4.

Figure 4:
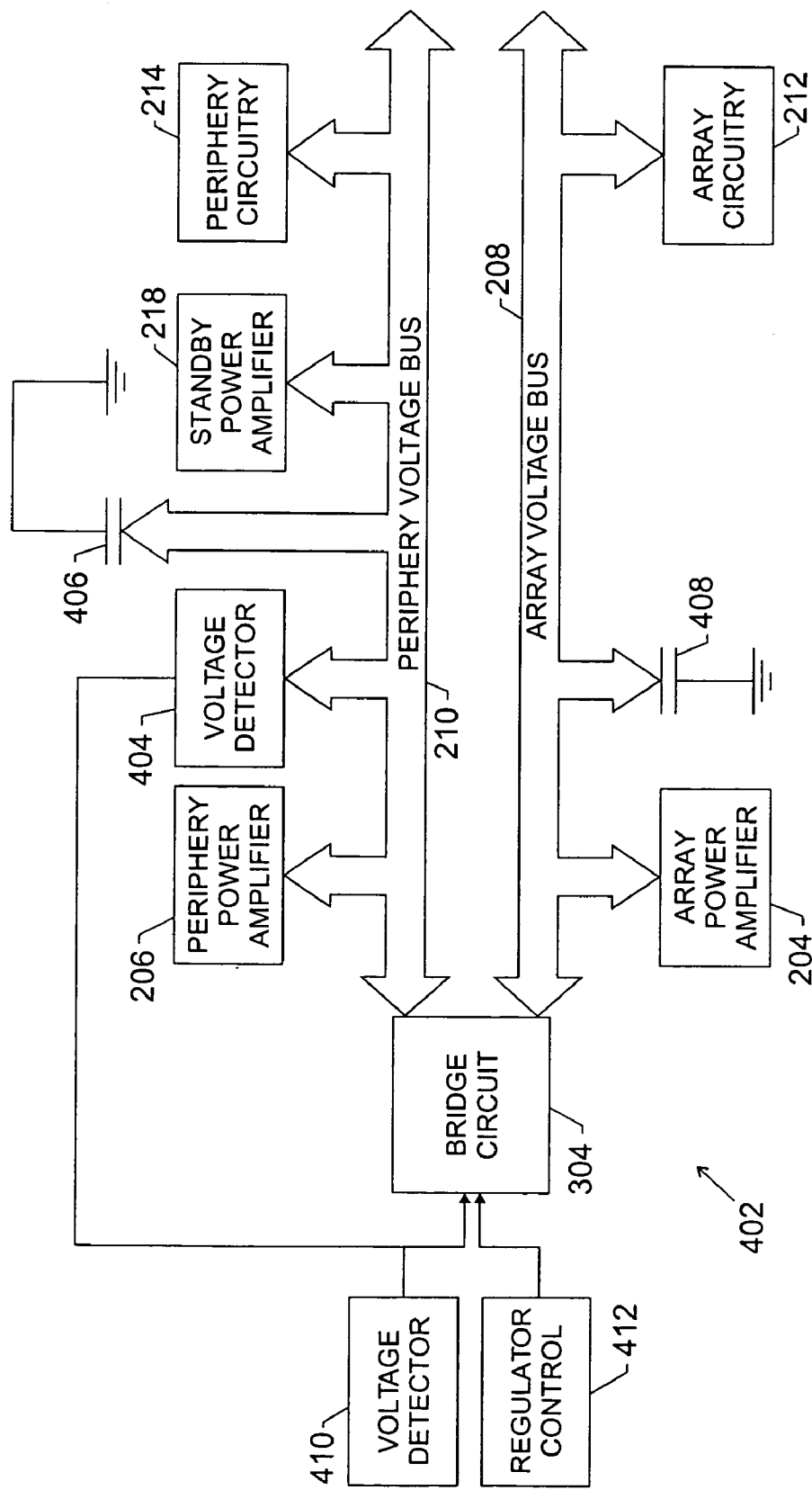
FIG. 4 illustrates a block diagram depicting a more detailed exemplary embodiment of the power distribution system in the semiconductor chip of FIG. 3 in accordance with aspects of the present technique.

A block diagram depicting a more detailed embodiment of the bridging circuit along with the various other components in a semiconductor chip, such as the semiconductor chip 302 of FIG. 3, is illustrated in FIG. 4. In this diagram, a power distribution system 402 of a semiconductor chip is shown. Power may be received by the power distribution system 402, in a manner similar to the discussion in FIG. 3. For instance, power may be distributed by the power distribution system 402 through the periphery power amplifier 206 to the periphery circuitry 214 and an array power amplifier 204 to the array circuitry 212. Also, as mentioned above, the power may be distributed to the array circuitry 212 and the periphery circuitry 214 through the standby power amplifier 218 during certain modes of operation.

In this embodiment, additional devices may be utilized to provide signals for operating the bridge circuit 304. For instance, one device that may be utilized may be a voltage detector 404, which may be coupled to the periphery voltage bus 210. The voltage detector 404 may be used to determine the voltage level on the periphery voltage bus 210, which may be used as an input control signal to the control logic that determines the mode of operation. Additionally, a periphery capacitor 406 may represent the capacitance of the periphery voltage bus 210, while an array capacitor 408 may represent the capacitance of the array voltage bus 208. The capacitors 406 and 408 may vary depending on the specific components in the respective circuits.

Also, the array voltage bus 208 and the periphery voltage bus 210 may connect the bridge circuit 304 and other circuitry that is utilized to operate the bridge circuit 304 together during different modes of operation. For instance, the bridge circuit 304, which may be one possible embodiment of a bridge circuit, may operate to isolate buses 208 and 210 or may operate to short buses 208 and 210 together, depending on the specific control signals received by the bridge circuit 304. To control the state of the bridge circuit 304, the voltage detector 404 along with a voltage detector 410 and a regulator control 412 may be coupled to the bridge circuit 304. The voltage detector 410 may be utilized to monitor voltage levels on the array voltage bus 208, the periphery voltage bus 210, and/or other buses. The voltage detector 404 or 410 may send a power-up control signal to the bridge circuit 304, which may be utilized to indicate the power-up mode or the initialization mode. The regulator control 412, which may be coupled to control circuitry and/or the processor, may send a control signal to the bridge circuit 304 to place the bridge circuit 304 into various states or modes, such as power-up mode, idle mode, activation mode, read/write burst mode, standby mode, and power-down mode, for example. In each of these modes, the bridge circuit 304 may couple the buses 208 and 210 together or may isolate the buses 208 and 210 from each other, depending on the control signal or condition sent to the bridge circuit 304.

For example, during the activation and/or the read/write burst modes, power may be delivered to the array voltage bus 208 and the periphery voltage bus 210 from the respective power amplifiers 204 and 206. Also, the regulator control 412 or the voltage detector 404 or 410 may send a control signal to the bridge circuit 304 that indicates an open circuit condition. As noted above, the activation mode may include executing commands in the circuitry 212 and 214, while the read/write mode may include accessing data from or delivering data to the circuitry 212 or 214. In each of these modes, the voltage on the array voltage bus 208 and the periphery voltage bus 210 may be different because the bridge circuit 304 is open and the buses 208 and 210 are isolated from the other.

Alternatively, during the standby mode, power may be delivered to the array voltage bus 208 and the periphery voltage bus 210 through the standby power amplifier 218. The regulator control 412 or the voltage detector 404 or 410 may send a control signal to the bridge circuit 304 to couple the array voltage bus 208 and the periphery voltage bus 210 together. This may allow the standby mode to maintain power to specific components, while other components are shut down. As such, the voltage applied to the array voltage bus 208 and the periphery voltage bus 210 may be about the same because the bridge circuit 304 couples the buses 208 and 210 together.

Also, during the power-up mode, the idle mode, and the power-down mode, power may be delivered to buses 208 and 210 through the respective power amplifiers 204 and 206. The regulator control 412 or the voltage detector 404 or 410 may each send a control signal to the bridge circuit 304 to couple the array voltage bus 208 and the periphery voltage bus 210 together. The power-up mode and power-down mode may distribute/reduce the power being supplied to various components within the array circuitry 212 and the periphery circuitry 214, as discussed above. Likewise, the idle mode may maintain power to the various components, while the power distribution system 402 is waiting for other instructions to be received. In each of these modes, the voltage supplied to the buses 208 and 210 may be approximately equal because the bridge circuit 304 couples the buses 208 and 210 together.

Advantageously, by implementing the bridging circuit 304 in these various modes, the power distribution system 402 may enhance the operation of the semiconductor chip. The bridging circuit 304 may enable the power distribution system 402 to minimize the amount of power utilized to operate the semiconductor chip by reducing duplication components and enabling the buses 208 and 210 to share the power amplifiers 204 and 206, the standby power amplifier 218, and the voltage detector 410. The shorting of the voltage buses 208 and 210 may reduce noise, such as current/voltage spikes or drops, and provide access to another voltage source for each of the circuits.

Furthermore, each of the buses 208 and 210 may also have different capacitances, which may effect the time it takes for the buses 208 and 210 to reach a predetermined voltage level for operation. As noted above, these capacitances may be represented by the array capacitor 406 and the periphery capacitor 408. For instance, during the power-up mode each of the array and periphery circuitry 212 and 214 has a different capacitance that influences the amount of time it takes to reach a certain voltage. The bridge circuit 304 may improve the operation of power distribution system 402 in the semiconductor chip by coupling the buses 208 and 210 together to reduce the total time it takes for both buses 208 and 210 to reach a predetermined operational voltage. The advantage of coupling these buses 208 and 210 together with regard to the ramp-up time is explained in greater detail with respect to FIG. 5.

Figure 5:
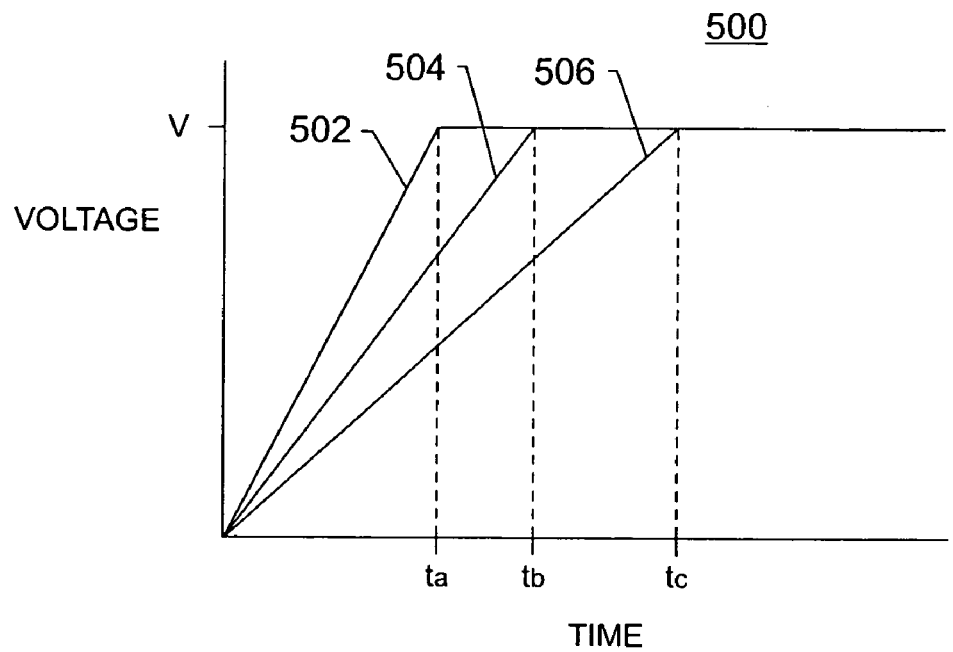
FIG. 5 illustrates a graph of time periods associated with various circuits to reach a specified voltage.

In FIG. 5, a graph 500, is shown with different illustrations of the ramp-up time for different circuits to reach an operational voltage. The ramp-up time period may be the amount of time a circuit uses to reach a specified voltage that is used to operate the circuit, for instance. In the graph 500, a first ramp-up time period 502 may be associated with a circuit that reaches the specified voltage level V at a time $t_A$. A second ramp-up time period 504 may be associated with a circuit that reaches the specified voltage level V at a time $t_B$, while a third ramp-up time period 506 may be associated with a circuit that reaches the specified voltage level V at a time $t_C$.

In operating the semiconductor chip, it may be beneficial to reach the voltage level V in the least amount of time. However, the capacitance of the respective circuits, such as the array circuitry 212 and the periphery circuitry 214, may influence the time it takes for each circuit to reach the specified voltage level V. This may be more clearly understood by concurrently viewing FIGS. 4 and 5. For instance, the periphery voltage bus 210 may have a capacitor 406 that results in a ramp-up time period 502, while the array voltage bus 208 may have an array capacitor 408 that results in a ramp-up time period 506. If the bridge circuit 304 is open, each of the buses 208 and 210 may reach the specified voltage level V at the different times $t_A$ and $t_C$. However, if the bridge circuit 304 couples the two buses 208 and 210 together, then the buses 208 and 210 may follow the ramp-up time period 504 and reach the specified voltage level V at times $t_B$. As a result, the power distribution system 402 may decrease the time it takes for both buses 208 and 210 to reach the specified voltage level V. Accordingly, the power distribution system 402 may reduce the total amount of time to reach an operational voltage, which may allow the semiconductor chip to become operational faster. A more detailed description of an exemplary embodiment of the bridge circuit 304 that is adapted to provide this flexibility is further explained with reference to FIG. 6.

Figure 6:
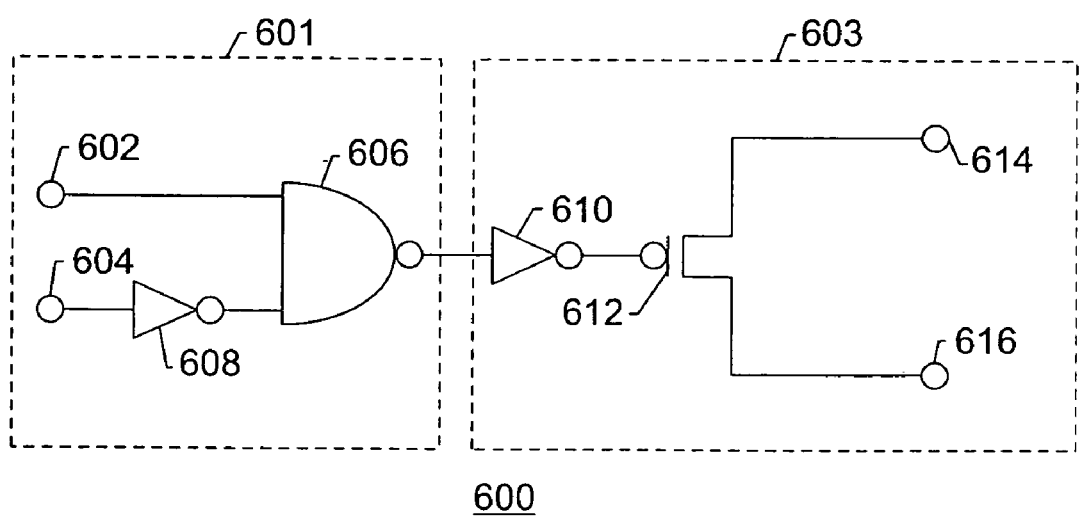
FIG. 6 illustrates a schematic diagram depicting an exemplary embodiment of the bridge circuit of FIGS. 3 and 4 in accordance with aspects of the present technique.

In FIG. 6, a schematic diagram depicting an exemplary embodiment of a bridge circuit 600, which may be used in the semiconductor chip 302 of FIG. 3 or the power distribution system 402 of FIG. 4, is illustrated. For clarity, FIG. 6 should be viewed concurrently with FIGS. 3 and 4 to provide a better understanding of the connectivity and operation of the bridge circuit 600. The bridge circuit 600 may include a first portion 601 that receives control signals and a second portion 603 that isolates the buses 208 and 210 from each other or couples the buses 208 and 210 together. The first section 601 may include a first input 602 and a second input 604 of the bridge circuit 600, which may receive control signals. The first input 602 may be coupled to a logic device 606, such as a "NAND" gate, and be adapted to receive a first control signal. As an example, the first control signal may be a power-up control signal delivered from the voltage detector 410 to indicate the power-up mode. The second input 604 may be coupled to a first inverter 608 and is adapted to receive a second control signal, which may indicate the power-up mode, the idle mode, the activation mode, the read/write burst mode, the standby mode, and/or the power-down mode. The second control signal may be delivered from the regulator control 412. The first inverter 608 may convert the second control signal to a "high" or "low" signal that is opposite of the signal received. The inverted second control signal is then delivered to the logic device 606. The logic device 606 may receive the first control signal and the inverted second control signal and combine the signals into an output signal.

Once the output signal is generated, it may be delivered to the second section 603 of the bridge circuit 600 to isolate buses 208 and 210 from each other or to couple the buses 208 and 210 together. The output signal is delivered to a second inverter 610, which converts the output signal from a "low" or a "high" signal to a signal that is the opposite of the signal received. The inverted output signal is then delivered to a logic gate 612, which is coupled between a first output 614 and a second output 616. As an exemplary embodiment, the logic gate 612 may be a P-channel (MOSFET) transistor with a gate connected to the output of the second inverter 610 and a source and a drain connected to the buses 208 and 210, respectively. The first output 614 may connect to the periphery voltage bus 210 and the second output 616 may connect to the array voltage bus 208. Once the logic gate 612 receives the inverted output signal, the logic gate 612 may open to isolate the buses 208 and 210 or may close to couple the buses 208 and 210 together. The operation of the bridge circuit 600 is described below for each of the various modes.

For instance, if the first input 602 is a "low" control signal or if the second input 604 is a "high" control signal, then the logic gate 612 may close to couple the outputs 614 and 616 together. However, if the first input 602 is a "high" control signal and the second input 604 is a "low" control signal then the logic gate 612 may remain open, which isolates outputs 614 and 616 from each other. In an exemplary embodiment, the power distribution system 402 may be adapted to provide the power-up control signal on the first input 602, and the activation, read/write burst, standby, and/or power down control signals on the second input 604. In this example, the power-up, activation, and read/write burst control signals are "low" when the associated mode is active and "high" when the associated mode inactive. Conversely, the idle, standby, and power-down control signals are "high" when the associated mode is active and "low" when the associated mode is inactive. As a result, the power-up, idle, standby, and power-down control signals couple the buses 208 and 210 together, while the activation, and read/write burst control signals isolate the buses 208 and 210 from each other. As such, the control signals may be delivered to the bridge circuit 600 to open or close the logic gate 612. The operation of the bridge circuit 600 may be further described in the process flow diagram of FIG. 7.

Figure 7:
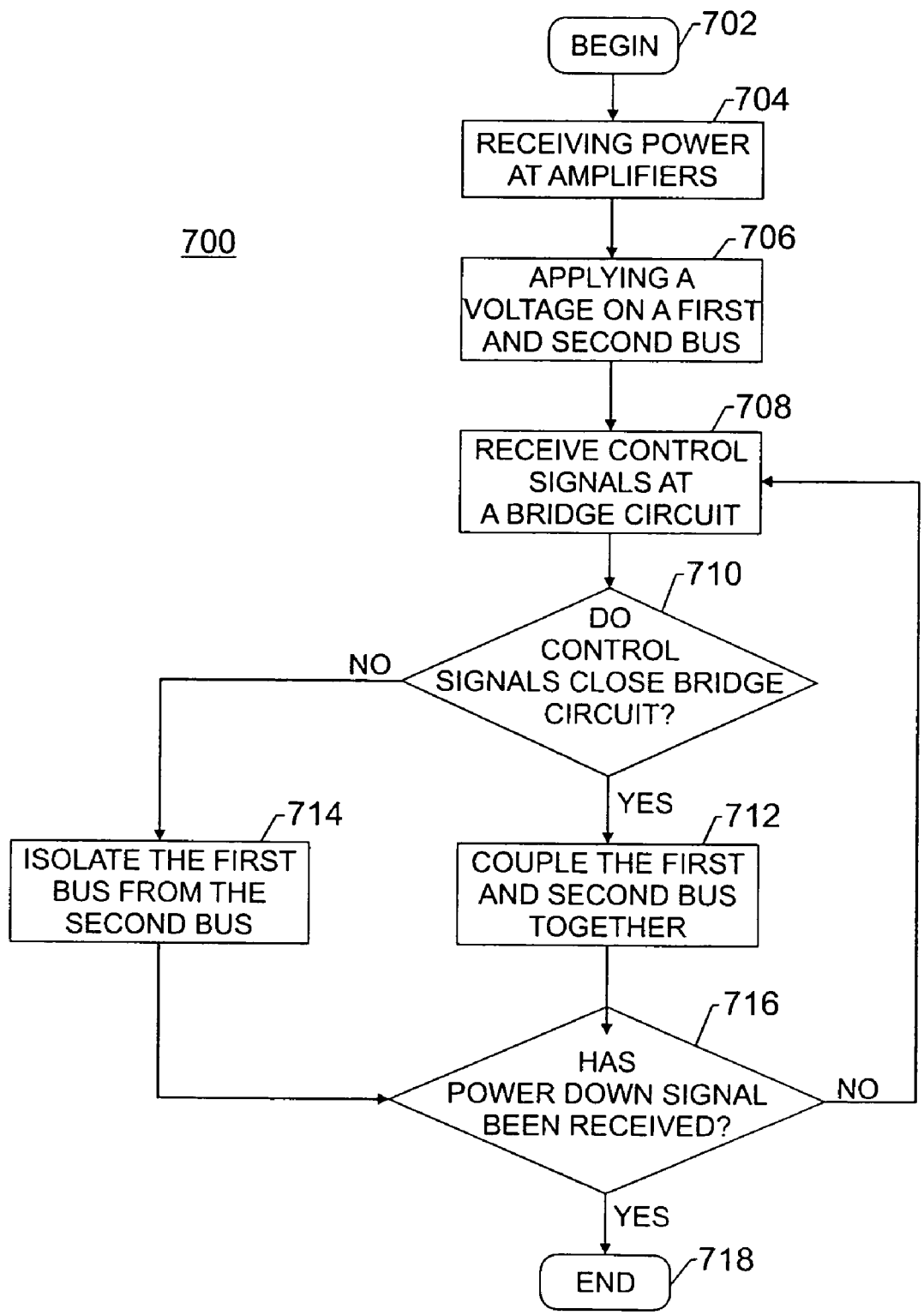
FIG. 7 illustrates a process flow diagram of the bridge circuit of FIGS. 3 and 4 in accordance with aspects of the present technique.

FIG. 7 is a process flow diagram showing the operation of a bridge circuit in accordance with embodiments of the present invention. In the diagram, generally referred to by reference numeral 700, a bridge circuit, such as the bridge circuit 304 or 600, may be implemented and utilized in a device, such as the semiconductor chip 302 of FIG. 3. The process flow diagram may be better understood by concurrently viewing FIGS. 3, 4 and 6. The process begins at block 702. At block 704, the amplifiers 204, 206 or 218 may receive power. As set forth above, the amplifiers 204, 206 or 218 may include multiple power amplifiers that are associated with specific circuits. At block 706, a voltage may be applied on a first and a second bus, such as buses 208 and 210. Also, the bridge circuit 304 may receive control signals from the voltage detector 404 or 410 and/or the regulator control 412. The control signals may correspond to the power-up, idle, activation, read/write burst, standby, and/or power-down mode.

Depending on the control signal received, the bridge circuit 304 determines whether to short the buses 208 and 210 together, as shown in block 710. The opening or closing of the bridge circuit 304 may be controlled by control signals received by the bridge circuit 304 and the signal received at the logic gate 612 within the bridge circuit 304. If the control signals indicate that the bridge circuit 304 should couple the buses 208 and 210, then the first bus 208 and the second bus 210 may be shorted together through the bridge circuit 304 at block 712. The coupling of the buses 208 and 210 may allow the buses 208 and 210 to maintain a similar voltage and share components, as discussed above. However, if the control signals indicate that the bridge circuit 304 should be open, then the buses 208 and 210 may be isolated to maintain different voltages by operating independently of each other, as shown at block 714. At block 716, the bridge circuit 304 may determine if a power down signal, which may indicate that the system is being powered or may result from a hard shutdown, has been received. If the bridge circuit 304 determines that the power down signal has not been received, then the bridge circuit 304 may continue to monitor the control signals at block 710. However, if a power down signal has been received, the process ends at block 718.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
   a processor; and
   a memory device coupled to the processor that comprises:
      a first voltage bus;
      a second voltage bus; and
      a bridge circuit coupled between the first voltage bus and the second voltage bus,
   wherein the bridge circuit is adapted to:
      receive an input signal;
      connect the first voltage bus and the second voltage bus together if the input signal is a first control signal; and
      isolate the first voltage bus from the second voltage bus if the input signal is a second control signal.

2. The system, as set forth in claim 1, wherein the memory device comprises a dynamic random access memory (DRAM) device.

3. The system, as set forth in claim 1, wherein the memory device comprises a static random access memory (SRAM) device.

4. The system, as set forth in claim 1, wherein the processor is coupled to a communication port to communicate with an input/output device.

5. The system, as set forth in claim 1, wherein the processor is coupled to a user interface.

6. The system, as set forth in claim 1, wherein the processor is coupled to a display to present information to a user.

7. The system, as set forth in claim 1, wherein the first voltage bus is a voltage supply bus for periphery circuitry and the second voltage bus is a voltage supply bus for array circuitry.

8. The system, as set forth in claim 1, wherein the processor is coupled to a power supply that is external to the memory device.

9. The system, as set forth in claim 8, comprising a plurality of power amplifiers coupled to the first voltage bus and adapted to:
   receive power from a power supply; and
   apply a voltage to the first voltage bus.

10. The memory device, as set forth in claim 8, comprising at least one standby amplifier coupled to one of the first voltage bus and the second voltage bus and adapted to supply power to the one of the first voltage bus and the second voltage bus.

11. The system, as set forth in claim 8, comprising at least one voltage detector coupled to one of the first voltage bus and the second voltage bus and adapted to determine the voltage on the one of the first voltage bus and the second voltage bus.

12. The system, as set forth in claim 11, wherein the at least one voltage detector generates the first control signal that is a power-up control signal.

13. The system, as set forth in claim 1, wherein the processor generates the second control signal that is an activation signal.

14. The system, as set forth in claim 1, wherein the bridge circuit comprises:
   a first input of a NAND gate coupled to a voltage detector;
   a first inverter coupled between a second input of the NAND gate and an output of a regulator control;
   a second inverter coupled between the output of the NAND gate and a gate of a transistor; and
   a source of the transistor coupled to the first voltage bus and a drain of the transistor to the second voltage bus.

15. A memory device comprising:
   a periphery voltage bus coupled to periphery circuitry;
   an array voltage bus coupled to array circuitry; and
   a bridge circuit coupled between the periphery voltage bus and the array voltage bus,
   wherein the bridge circuit is configured to:
      receive an input signal;
      connect the periphery voltage bus and the array voltage bus together if the input signal is a first control signal; and
      isolate the periphery voltage bus from the array voltage bus if the input signal is a second control signal.

16. The memory device, as set forth in claim 15, wherein the memory device comprises a dynamic random access memory (DRAM) device.

17. The memory device, as set forth in claim 15, wherein the memory device comprises a static random access memory (SRAM) device.

18. The memory device, as set forth in claim 15, comprising a plurality of power amplifiers coupled to the periphery voltage bus and adapted to receive power being generated by a device external to the memory device.

19. The memory device, as set forth in claim 15, comprising a plurality of standby amplifiers coupled to one of the periphery voltage bus and the array voltage bus, wherein the plurality of standby amplifiers supplies power to periphery circuitry and the array circuitry.

20. The memory device, as set forth in claim 15, comprising at least one voltage detector coupled to one of the periphery voltage bus and the array voltage bus, wherein the at least one voltage detector is adapted to determine the voltage on one of the periphery voltage bus and the array voltage bus.

21. The memory device, as set forth in claim 15, wherein the first control signal comprises a power-up control signal.

22. The memory device, as set forth in claim 15, wherein the first control signal comprises a standby control signal.

23. The memory device, as set forth in claim 15, wherein the second control signal comprises an activation control signal.

24. A method of operating a device comprising the acts of:
   providing a first voltage to a periphery voltage bus and a second voltage to an array voltage bus;
   receiving a control signal at a bridge circuit;
   determining if the control signal indicates one of a first condition and a second condition;

coupling the periphery voltage bus to the array voltage bus if the control signal indicates the first condition; and isolating the periphery voltage bus from the array voltage bus if the control signal indicates the second condition.

25. The method, as set forth in claim 24, wherein the periphery voltage bus reaches the first voltage in a first time period and the array voltage bus reaches the second voltage in a second time period when the periphery voltage bus is isolated from the array voltage bus, wherein the first time period is different from the second time period.

26. The method, as set forth in claim 24, wherein the periphery voltage bus reaches the first voltage in a third time period and the array voltage bus reaches the second voltage in the third time period, when the periphery voltage bus and the array voltage bus are coupled together, wherein the third time period is different than each of the first time period and the second time period.

27. The method, as set forth in claim 26, wherein the third time period is greater than or equal to one of the first and second time periods and less than or equal to another of the first and second time periods.

28. The method, as set forth in claim 24, comprising determining if the control signal is a power down control signal.

29. The method, as set forth in claim 24, wherein the second condition comprises an activation signal.

30. The method, as set forth in claim 24, wherein the first condition comprises a power-up signal.

31. The method, as set forth in claim 24, comprising supplying the first voltage and the second voltage from a plurality of standby amplifiers attached to one of the periphery voltage bus and the array voltage bus.

32. The method, as set forth in claim 24, comprising monitoring the first voltage and the second voltage from a voltage detector coupled to one of the periphery voltage bus and the array voltage bus.

33. A method of manufacturing a memory device comprising the acts of:

providing a memory device having a first voltage bus and a second voltage bus;

coupling a power amplifier to one of the first voltage bus and the second voltage bus;

coupling a bridge circuit to the first voltage bus and the second voltage bus;

encoding the memory device to provide a first control signal that couples the first voltage bus to the second voltage bus in response to a first condition; and encoding the memory device to provide a second control signal that isolates the first voltage bus from the second voltage bus in response to a second condition.

34. The method, as set forth in claim 33, comprising coupling a voltage detector to one of the first voltage bus and the second voltage bus.

35. The method, as set forth in claim 34, comprising encoding the voltage detector to measure voltage on one of the first voltage bus and the second voltage bus.

36. The method, as set forth in claim 33, comprising coupling a regulator control to the bridge circuit, wherein the regulator control is configured to deliver one of the one of the first control signal and the second control signal to the bridge circuit.

37. The method, as set forth in claim 36, wherein in the bridge circuit comprises:

coupling a first input of a NAND gate to a voltage detector;

coupling a first inverter between a second input of the NAND gate and an output of the regulator control;

coupling a second inverter between the output of the NAND gate and a gate of a transistor; and coupling a source of the transistor to the first voltage bus and a drain of the transistor to the second voltage bus.

38. The method, as set forth in claim 33, comprising coupling a standby amplifier to one of the first voltage bus and the second voltage bus to provide power to the first and second voltage buses.

39. The method, as set forth in claim 33, comprising coupling periphery circuitry to the first voltage bus.

40. The method, as set forth in claim 33, comprising coupling array circuitry to the second voltage bus.

* * * * *